(12) United States Patent
Legen et al.

(10) Patent No.: US 7,796,393 B2
(45) Date of Patent: Sep. 14, 2010

(54) ASSEMBLY DEVICE AND ASSEMBLY METHOD FOR A COOLING ELEMENT

(75) Inventors: Anton Legen, Munich (DE); Steve Wood, Munich (DE)

(73) Assignee: Qimonda AG, Munich (DE)

( * ) Notice: Subject to any disclaimer, the term of this patent is extended or adjusted under 35 U.S.C. 154(b) by 267 days.

(21) Appl. No.: 11/954,186

(22) Filed: Dec. 11, 2007

(65) Prior Publication Data

US 2009/0135565 A1 May 28, 2009

(30) Foreign Application Priority Data

Nov. 27, 2007 (DE) .................. 10 2007 056 952

(51) Int. Cl.
*H05K 7/20* (2006.01)
(52) U.S. Cl. .................. 361/715; 361/704; 361/726; 165/80.3; 165/185; 403/5; 257/E23.086
(58) Field of Classification Search .................. 361/701, 361/704, 707, 709, 715, 719, 721
See application file for complete search history.

(56) References Cited

U.S. PATENT DOCUMENTS

| | | | |
|---|---|---|---|
| 6,278,610 B1 * | 8/2001 | Yasufuku et al. | 361/704 |
| 7,151,668 B1 * | 12/2006 | Stathakis | 361/700 |
| 7,471,514 B2 * | 12/2008 | Chen | 361/695 |
| 2003/0076657 A1 * | 4/2003 | Summers et al. | 361/719 |
| 2003/0146176 A1 * | 8/2003 | Danello et al. | 211/26 |
| 2004/0250989 A1 * | 12/2004 | Im et al. | 165/80.1 |
| 2007/0263361 A1 | 11/2007 | Lai et al. | |

\* cited by examiner

*Primary Examiner*—Jayprakash N Gandhi
*Assistant Examiner*—Courtney Smith
(74) *Attorney, Agent, or Firm*—Slater & Matsil, L.L.P.

(57) ABSTRACT

A device can be used for applying a cooling element onto a module. The cooling element has a first side part and a second side part opposite the first side part. The first and second side parts are connected by a region. The device includes a spreader, which is adapted to spread apart the first and second side parts by mechanical pressure action on mutually opposite sides of the first and second side parts, so as to be able to guide a predetermined region of the module between the first and second side parts.

16 Claims, 10 Drawing Sheets

ASSEMBLY DEVICE AND ASSEMBLY METHOD FOR A COOLING ELEMENT

This application claims priority to German Patent Application 10 2007 056 952.3, which was filed Nov. 27, 2007 and is incorporated herein by reference.

TECHNICAL FIELD

Embodiments of the present invention relate to an assembly device and an assembly method for assembly of a cooling element for a module, in particular to devices and methods for the assembly of such cooling elements on memory modules.

BACKGROUND

Through steadily increasing storage density on memory modules, such as Dual Inline Memory Modules (DIMM), and buffer chips possibly also present on memory modules in addition, such as a so-called Advanced Memory Buffer (AMB) in Fully Buffered DIMMs (FB DIMMs), there may be substantial heat development during operation of the memory modules. In FB DIMMs, for example, the JEDEC (Joint Electron Device Engineering Council) standard provides a cooling element as part of the memory module (FB DIMM). This cooling element is also referred to as FMHS (Full Module Heat-Spreader). With particularly high thermal requirements for FB DIMMs, it may occur that cooling action of the FMHS is not efficient. In this case, a further additional cooling element can be attached to the memory module. This may, for example, be done by plugging or clamping the additional cooling element onto the FHMS already present. To this end, an assembly device is needed.

BRIEF DESCRIPTION OF THE DRAWINGS

Embodiments of the present invention will be explained in greater detail in the following with reference to the accompanying drawings, in which.

DETAILED DESCRIPTION OF ILLUSTRATIVE EMBODIMENTS

Figure 1A:
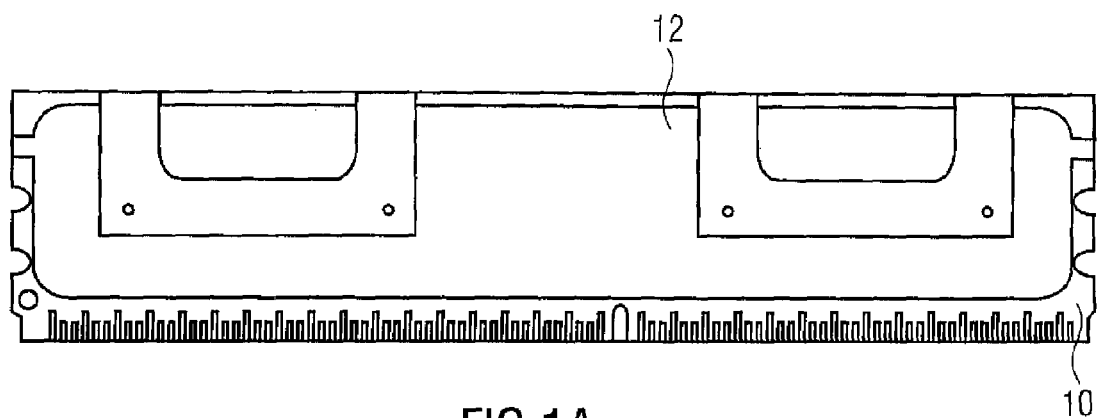
FIG. 1A is an illustration of an FB DIMM.

With respect to the subsequent description, it is to be noted that the same or similarly acting functional elements have the same reference numerals in the different embodiments, and hence the description of the functional elements is exchangeable in the various embodiments illustrated in the following.

FIG. 1A shows an FB DIMM 10 with a metallic standard cooling element 12 to remove a thermal load from the FB DIMM 10. In special applications, in which the FB DIMM 10 is accessed frequently and at high memory clock rates, for example, it may occur that the cooling power of the standard cooling element 12 is not sufficient. In this case, an additional, external cooling element can be provided so as to guarantee necessary cooling power for the FB DIMM 10.

Figure 1B:
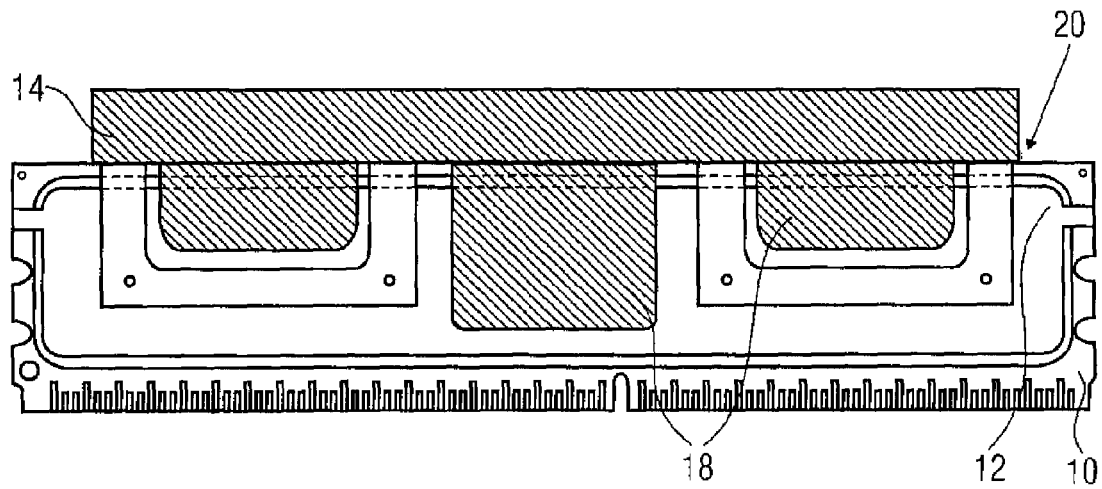
FIG. 1B is an illustration of an FB DIMM with additional cooling element.

In this respect, FIG. 1B shows the FB DIMM 10 with standard cooling element 12, wherein a further cooling element 14 is additionally applied onto the standard cooling element 12. The additional cooling element 14 may be a metallic cooling element, such as a copper cooling element. The additional cooling element 14 comprises side parts 18, 20, with which it can be clamped onto the sides of the standard cooling element 12 of the FB DIMM 10.

Figure 1C:
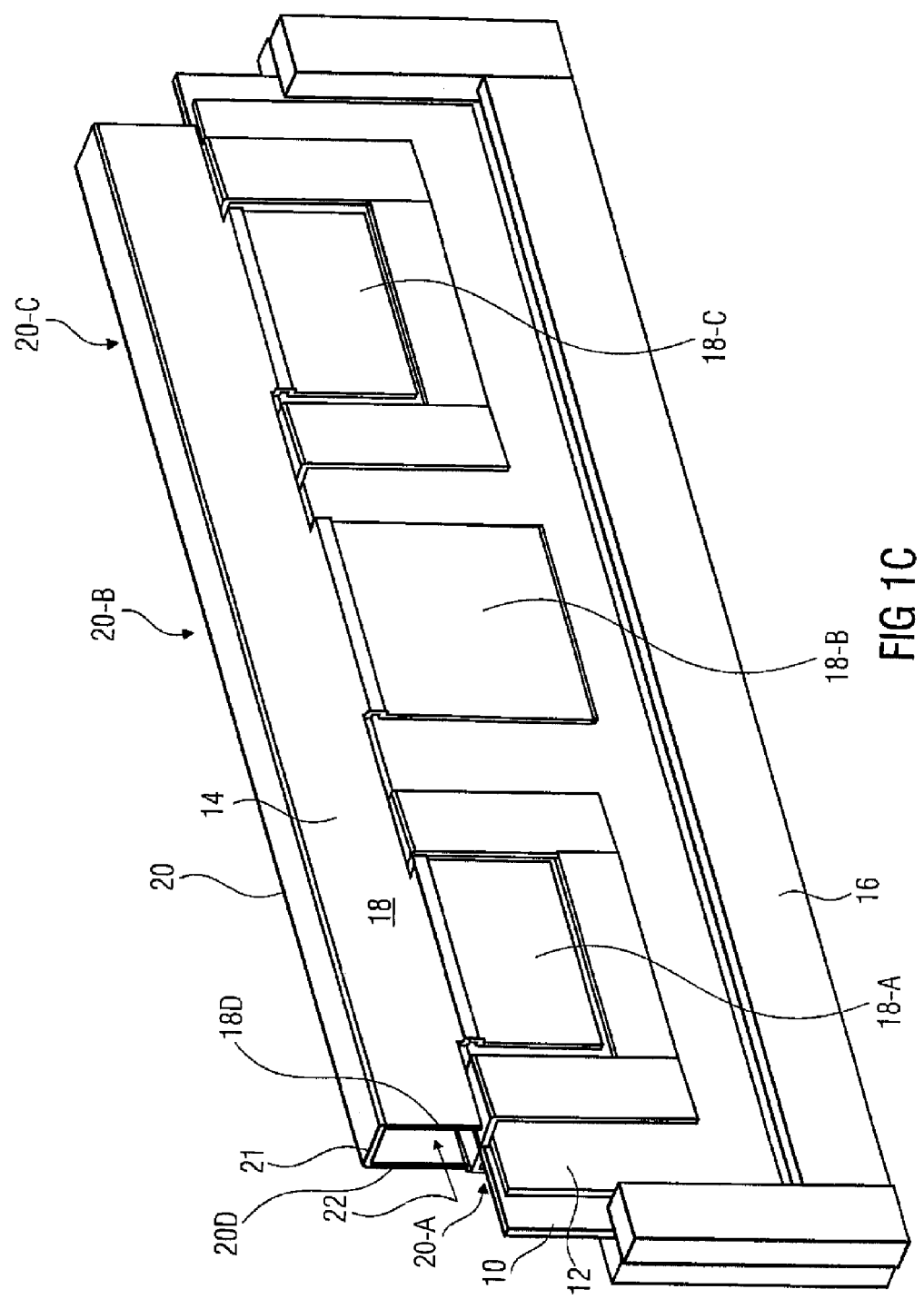
FIG. 1C is a perspective illustration of an FB DIMM with external cooling element plugged into a socket.

FIG. 1C shows a perspective illustration of an FB DIMM with additional cooling element 14, located in a memory module socket.

The additional cooling element 14 comprises a first side part 18 with sections 18-A, 18-B and 18-C protruding from a first cooling channel sidewall 18D, and a second side part 20 with sections 20-A, 20-B and 20-C protruding from a second cooling channel sidewall 20D. The first and second side parts 18, 20 are connected by a region 21, which contributes to the formation of a cooling channel 22 of the additional cooling element 14 together with the cooling channel sidewalls 18D and 20D. Air may, for example, be streamed through the cooling channel 22 so as to remove waste heat from the FB DIMM 10, so that cooling of the FB DIMM 10 may take place. Here, the additional cooling element 14 is compatible with conventional FB DIMMs or FMHS designs, i.e., it can be clamped onto standard cooling elements for FB DIMMs.

In order to clamp the side parts 18, 20 of the additional cooling element 14 onto the FB DIMM 10 with standard cooling element 12, a temporary spreading or expansion of the first and second side parts 18, 20 of the additional cooling element 14 is necessary so as to be able to guide the FB DIMM 10 with standard cooling element 12 between the first and second side parts 18, 20. Exemplary embodiments illustrated herein deal with methods and devices to apply a cooling element, like the additional cooling element 14 exemplarily shown, onto a module, in particular a memory module.

Figure 2:
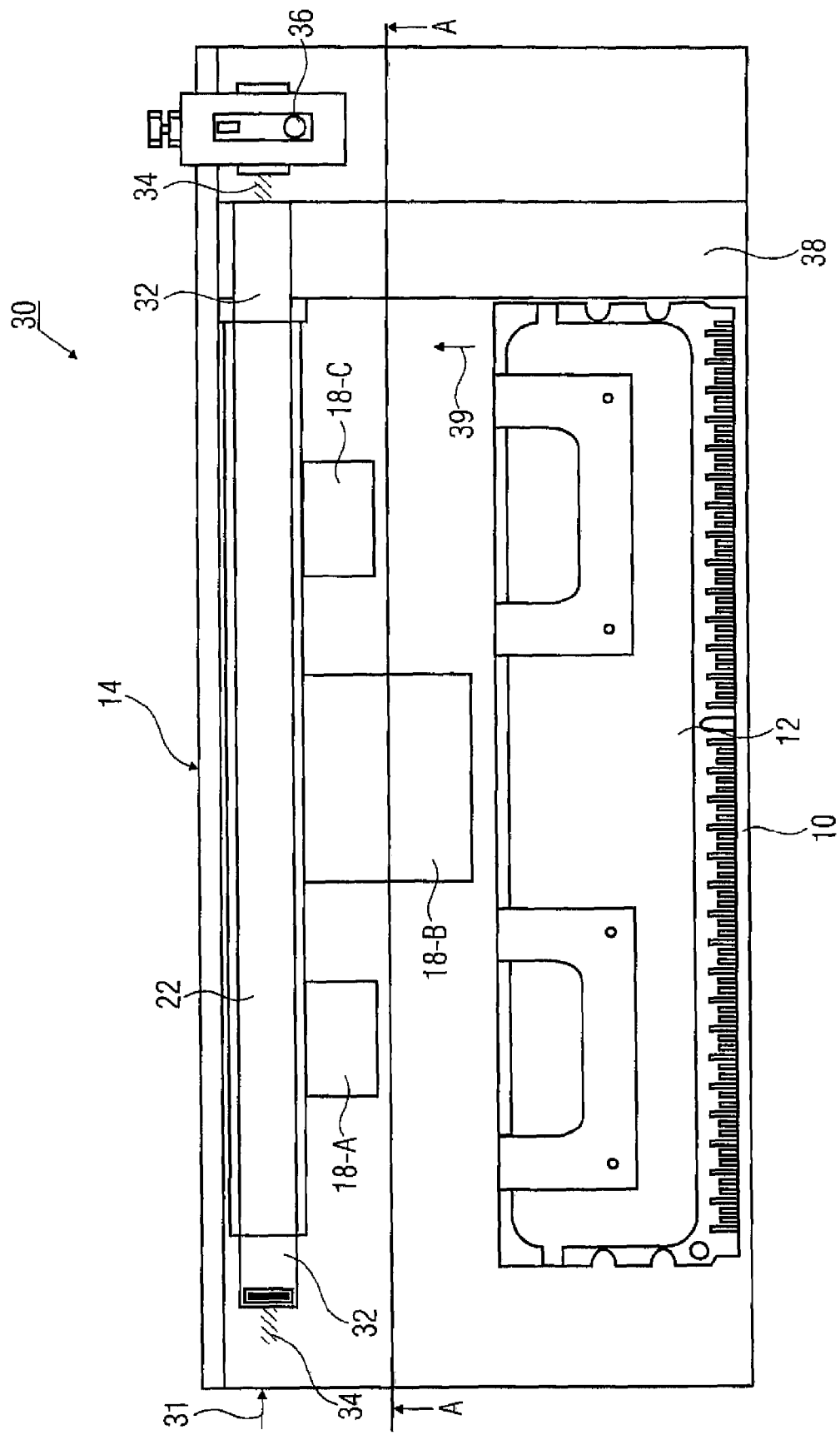
FIG. 2 is a top view onto a device for applying a cooling element onto a memory module according to an exemplary embodiment.

FIG. 2 shows an exemplary embodiment of a device 30 for applying a cooling element 14 onto a memory module 10. The cooling element 14 corresponds to the cooling element shown in FIG. 1c.

The device 30 comprises a spreading means 32, onto which the cooling channel 22 of the cooling element 14 can be slid. The shape of the spreading means 32 is adapted to the cooling channel 22 of the cooling element 14, so that the cooling channel 22 can be slid over the spreading means 32. According to embodiments, the spreading means 32 is adapted so as to convert a rotational movement into a pressure force onto the cooling channel sidewalls 18D, 20D, so that the side parts are spread apart so that a predefined region of the memory module 10 can be guided between the first and second side parts 18, 20 of the cooling element 14. In the embodiment shown, the predefined region of the memory module 10 is guided between the opposite sections 18-A, 18-B, 18-C and 20-A, 20-B, 20-C. The spreading means thus acts on first regions of the side parts, while the module is slid between second regions of the side parts different from the first side parts.

The rotational movement can be generated by a rotation axle 34, which to this end is coupled to a lever 36, for example, according to an exemplary embodiment. This means movement of the lever 36 results in a rotational movement of the rotation axle 34. Here, according to an exemplary embodiment, the rotation axle may be rigidly connected to the spreading means 32. In this case, the rotation axle 34 at the same time is the rotation axle of the spreading means 32, which may comprise a cam according to an embodiment. By the rotational movement of the cam, over which the cooling channel 22 of the cooling element 14 is guided, the side parts 18, 20 can be spread, and the module 10 can be guided along a guide rail 38 in a direction 39 perpendicular to the longitudinal axis of the spreading means 32 between the spread first and second side parts 18, 20, as indicated by the arrow 39.

According to a further embodiment, the rotation axle 34 can be threaded so as to cause shift of parts of the spreading means 32 by a rotational movement, so that the side walls of the cooling channel 22 or the first and second side parts 18, 20 can be urged apart by this shift, so that the module 10 can be slid between the first and second side parts 18, 20 along the guide rail 38.

After the module 10 has been slid between the spread first and second side parts 18, 20 along the guide rail 38, the spreading of the first and second side parts 18, 20 is reversed, so that the cooling element 14 is fixed on the module 10. Then, the cooling element 14 may again be slid or removed from the spreading means 32 together with the module 10.

The spreading concepts already indicated previously will now be explained in greater detail in the following on the basis of FIGS. 3 to 8.

Figure 3:
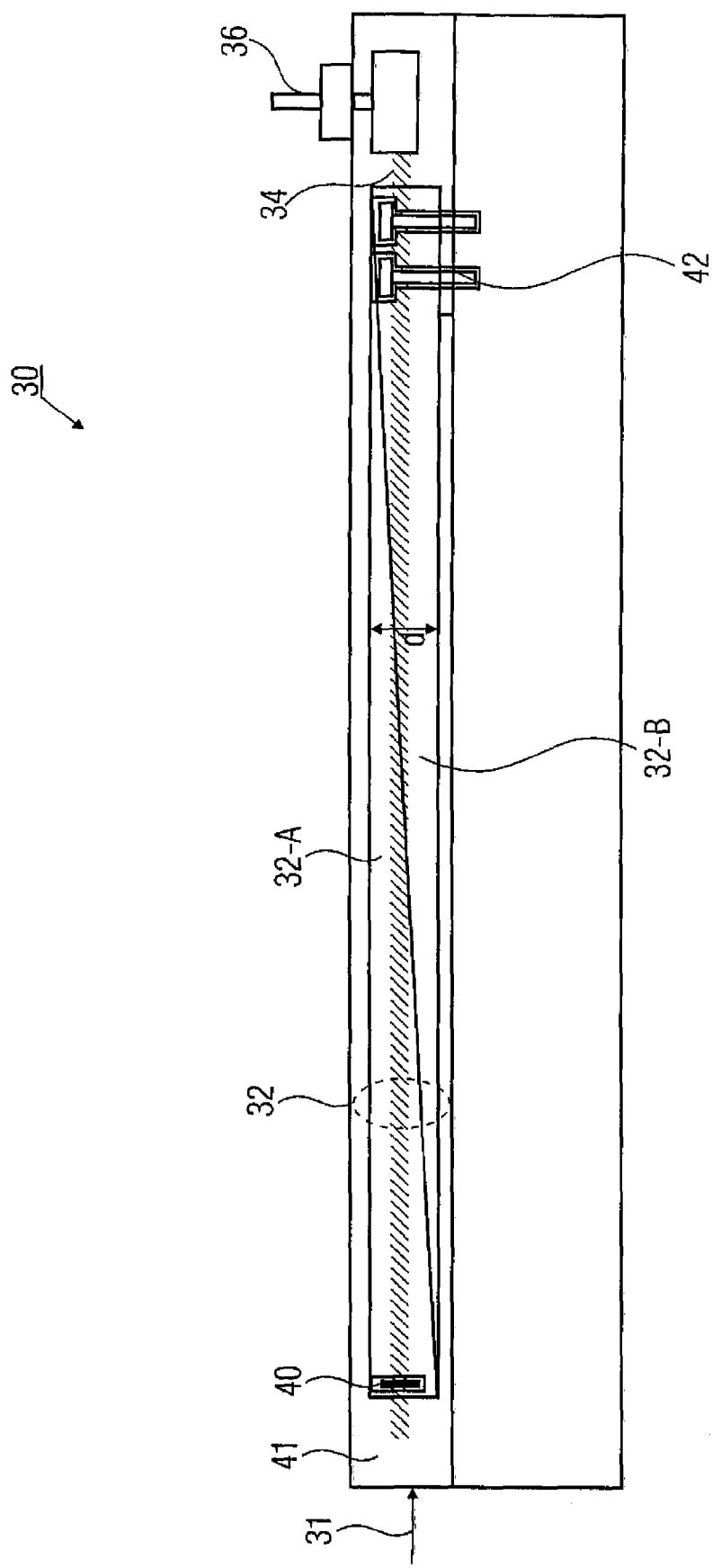
FIG. 3 is a front view of the device shown in FIG. 2.
Figure 4:
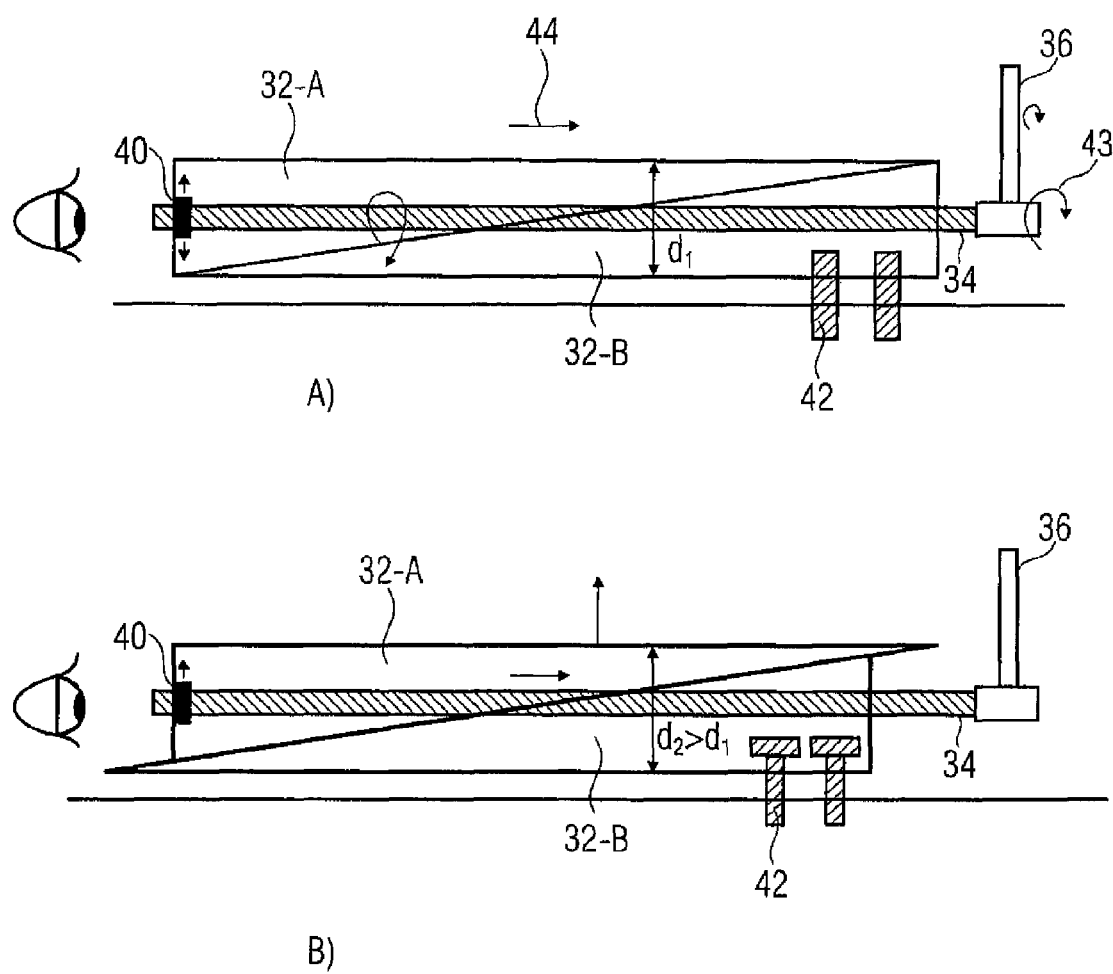
FIGS. 4A and 4B are front views of the device shown in FIG. 2, for explaining its functioning.

FIG. 3 shows a view of the assembly device 30 shown in FIG. 2 perpendicular to the plane AA'.

The spreading means 32 includes two wedges 32-A, 32-B slidable against each other. In FIG. 3, the two wedges 32-A, 32-B slidable against each other are in a first position, in which the cooling element 14 and/or its cooling channel 22 (not shown) can be guided over the two wedges 32-A, 32-B slidable against each other. To this end, the assembly device 30 comprises a guiding region 41 for the cooling channel 22 of the cooling element 14, wherein the guiding region 41 is adapted so as to slide the cooling element 14 with its cooling channel 22 in a direction 31, parallel to the longitudinal axis of the spreading means 32 and perpendicular to the direction 39, onto the spreading means 32. Through the two wedges 32-A, 32-B, there passes a threaded rotation axle or rod 34, which, for example, is coupled to the lever 36, so that the threaded rod 34 can be made to move rotationally by a lever movement of the lever 36. According to an embodiment, the wedges 32-A, 32-B are formed to be internally hollow, so that the threaded rod 34 can pass therethrough. In an embodiment, a first wedge 32-A is provided with a mating thread 40 with respect to the thread of the threaded rod 34, and the threaded rod 34 is guided through the mating thread 40. The second wedge 32-B is fixedly connected or fixed to the device 30 by at least one retaining bolt 42 with respect to the device 30, so that it cannot move with respect to the device 30.

By rotating the threaded rod 34 and/or moving the lever 36, the first wedge 32-A can be shifted to the right with respect to the second wedge 32-B. By the slanting ramps of the wedges 32-A, 32-B, such a shift at the same time results in an upward movement of the first wedge 32-A. It is to be noted that directional indications used here each refer to the drawing plane.

A skilled person, when viewing FIG. 3, will recognize that a distance d between the outer walls of the two wedges 32-A, 32-B, can be increased by shifting the first wedge 32-A to the right with respect to the second wedge 32-B. This fact is to be explained in great detail on the basis of FIGS. 4A and 4B.

By movement of the lever 36, the threaded rod 34 can be made to move rotationally, as indicated by the rotation arrow 43 drawn in FIG. 4A. The thread of the threaded rod 34 rotates in the mating thread 40 of the first wedge 32-A, whereby a force in the direction of the arrow 44 can be exerted thereon. Thereby, the first wedge 32-A shifts from a first position illustrated in FIG. 4A to a second position illustrated in FIG. 4B. The distance $d_2$ resulting therefrom between the outer walls of the wedges 32-A, 32-B is greater than the first distance $d_1$ between the outer walls in the first position of the wedges 32-A, 32-B. According to embodiments, the mating thread 40 arranged on the first wedge 32-A is slidably arranged in an axis perpendicular to the threaded rod 34, so as to be able to balance a movement of the first wedge 32-A perpendicular to the threaded rod 34. To this end, the mating thread 40 may, for example, be arranged in a retaining nut, which is freely movable in a guide rail embedded in the first wedge 32-A.

Figure 5A:
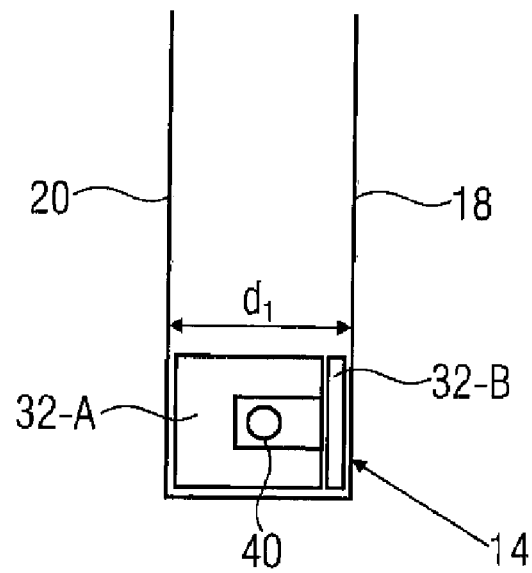
FIGS. 5A and 5B are side views of the front views shown in FIGS. 4A and 4B.
Figure 5B:
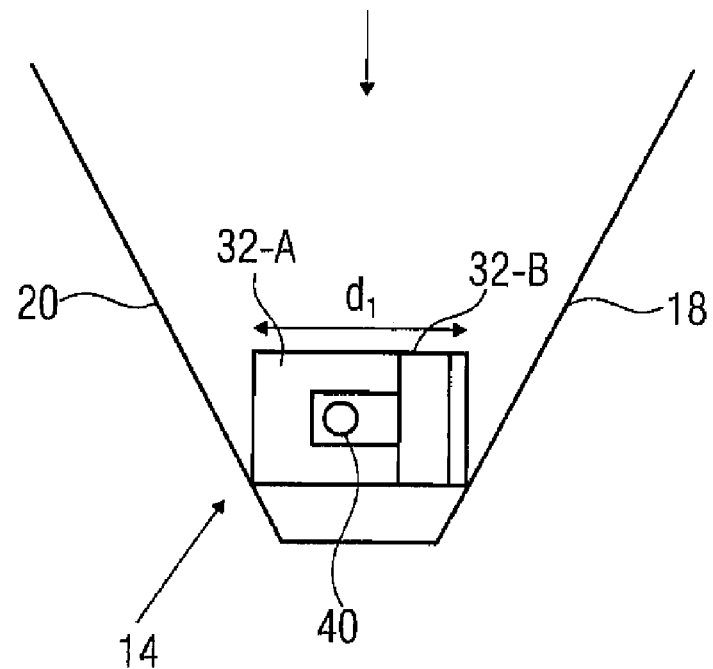

FIGS. 5A and 5B show the shift of the two wedges 32-A, 32-B shown in FIGS. 4A and 4B from the viewing directions each indicated in FIGS. 4A and 4B.

In FIGS. 5A and 5B each, also the cooling element 14 slid onto the spreading means 32 and/or the two wedges 32-A, 32-B with its first and second side parts 18, 20 is schematically illustrated additionally. While the side parts 18, 20 of the cooling element 14 are not spread in the first position of the two wedges 32-A, 32-B (FIG. 5A), the side parts 18, 20 of the cooling element 14 are spread apart in the second position (FIG. 5B), in which the first wedge 32-A is shifted from the first position or its initial location with respect to the second wedge 32-B, so that the memory module 10 can be slid between the spread side parts 18, 20 from the direction indicated with the arrow in FIG. 5B.

If the memory module 10 is in a default position between the spread side parts 18, 20, the spreading process is reversed by bringing the two wedges 32-A, 32-B back into their initial position again. This is done by opposite movement of the lever 36, for example.

At this point, it is to be mentioned that the rotational movement of the threaded rod or rotation axle 34 may of course also take place in automatic manner, for example, by a servo motor.

Figure 6:
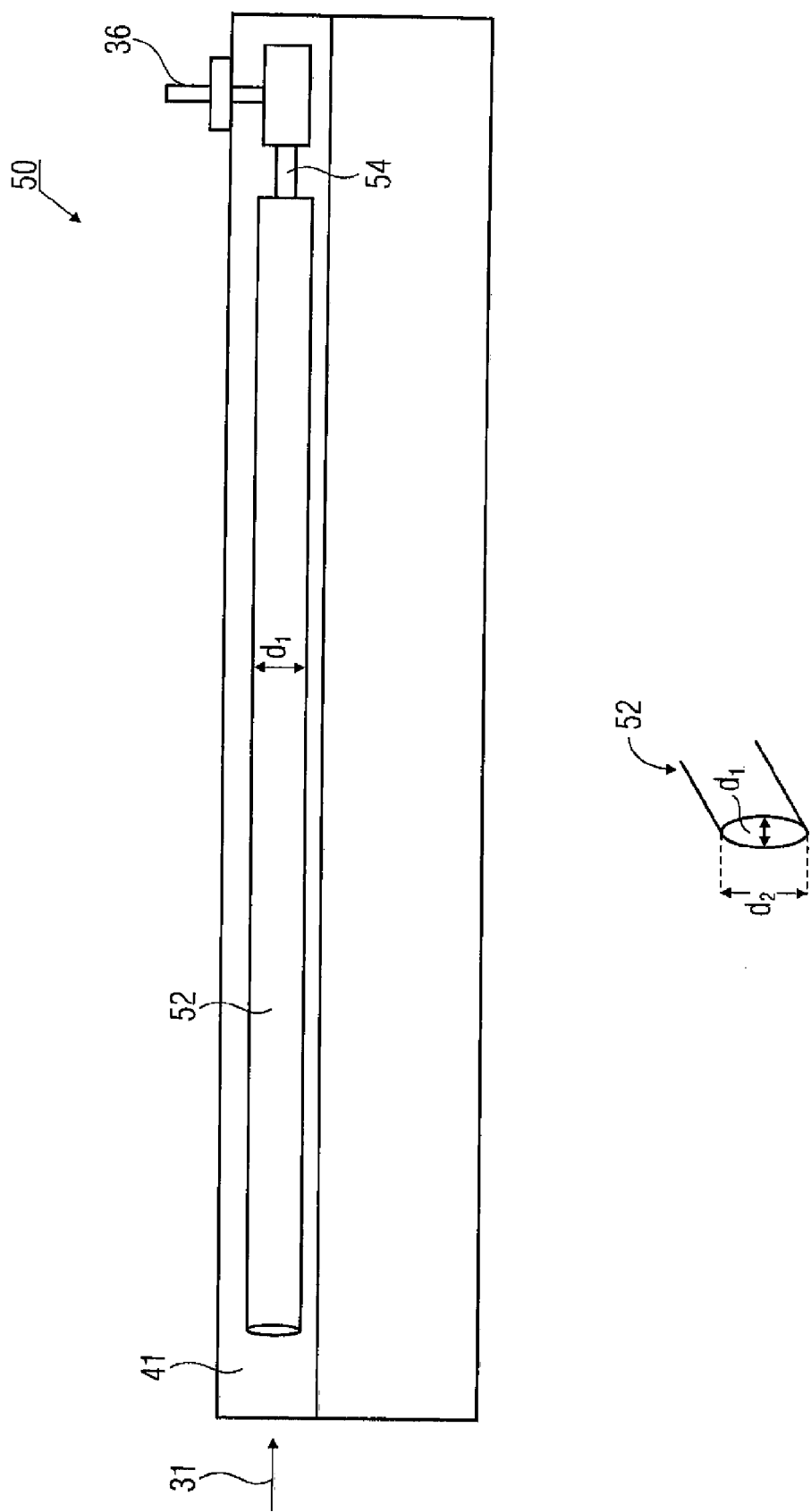
FIG. 6 shows a device for applying a cooling element onto a memory module, according to a further exemplary embodiment.
Figure 7:
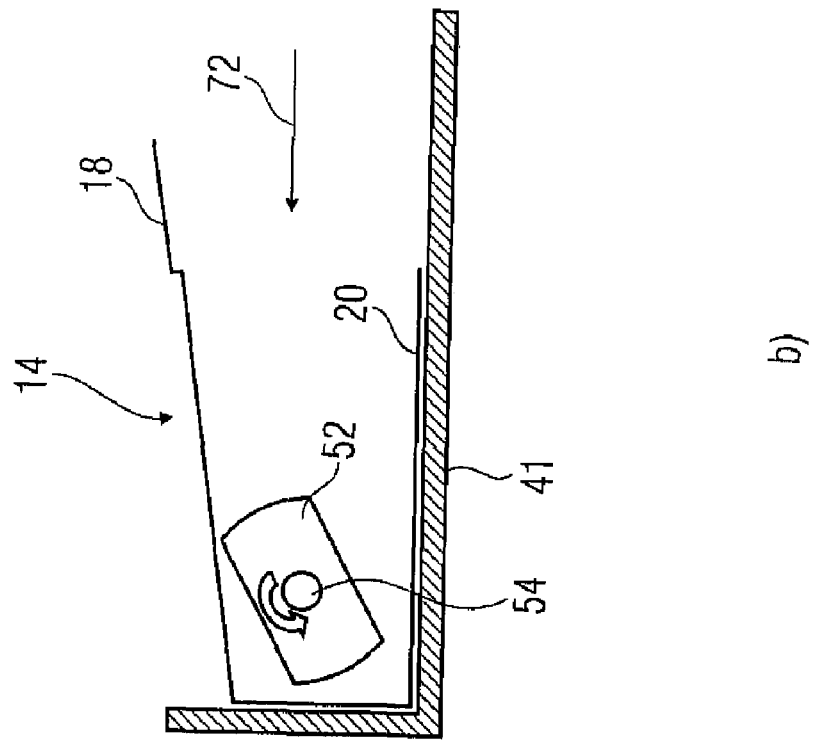
FIGS. 7A and 7B are schematic side views of a cam for spreading cooling element side parts.
Figure 7:
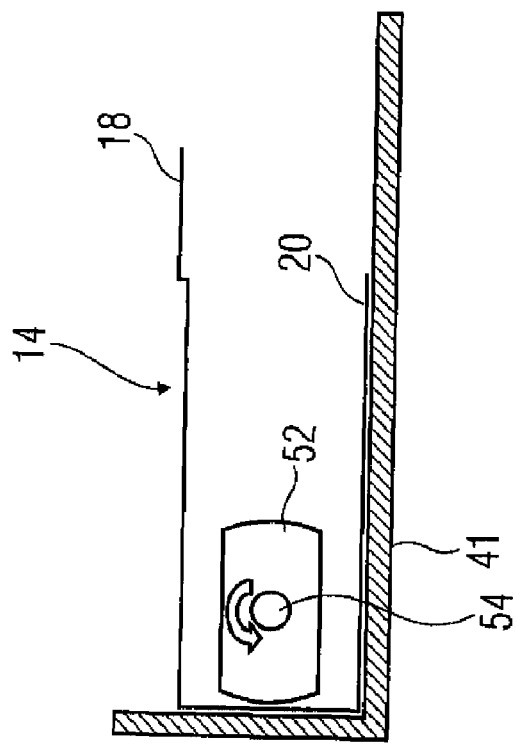

FIG. 6 schematically shows, similar to FIG. 3, a front view of a further embodiment of an assembly device for applying a cooling element 14 onto a memory module 10.

In the assembly device 50 shown in FIG. 6, the spreading means 52 comprises a cam. Here, below a cam, for example, a curve-like protrusion is to be seen on a rotatable shaft 54, wherein the cam may cause spreading of the two side parts 18, 20 of the cooling element 14 (not shown) as result of a rotational movement of the shaft 54, for example, triggered by the lever 36. Furthermore, the cam 52 could also have an oval or ellipse-shaped cross section, as schematically shown in FIG. 6 (below). The cam 52 has a first diameter $d_1$ in a first position with respect to a predetermined direction, and a second diameter $d_2 > d_1$ in a second position, for example after a 90° rotation.

The spreading means 52 can also be formed similar to a cam shaft, according to embodiments, so that cam elements are only present at selected locations of the shaft 54. Like the embodiments already described previously, the assembly device 50 illustrated in FIG. 6 comprises a guiding region 38 (see FIG. 3) for the module 10, wherein the guiding region 38 is adapted so as to be able to move the module in a direction 39 perpendicular to the longitudinal axis of the spreading means 52 into a predetermined position with respect to the spreading means 52. Furthermore, the assembly device 50 comprises a guiding region 41 for the cooling channel 22 of the cooling element 14, wherein the guiding region 41 is adapted so as to shift the cooling element 14 with its cooling channel 22 in a direction 31 parallel to the longitudinal axis of the spreading means 52 and perpendicular to the direction 39 onto the spreading means 52.

The functioning of a spreading means in the form of a cam is explained in greater detail in the following on the basis of FIGS. 7A and 7B.

FIG. 7A shows a side view of a part of the assembly device 50. In the illustration shown in FIG. 7A, a cooling element 14, which is slid onto the cam 52 in the guiding region 41, with a first and second side part 18, 20 can be seen. The cam 52 is in a first position, so that the two side parts 18, 20 are not spread. By rotational movement about the rotation axle or shaft 54, the cam 52 can be brought into a second position, as schematically shown in FIG. 7B. By the cam 52 not being formed in a rotation-symmetrical manner, the diameter of the cam changes with respect to an axis perpendicular to the non-spread side parts 18, 20 by the rotational movement. By increasing the diameter of the cam 52, the two side parts 18, 20 of the cooling element 14 are spread, and the memory module 10 can be slid between the two side parts 18, 20 in the direction indicated by the arrow 72.

In embodiments, a rotational movement about a rotation axle 34, 54 may thus be converted into a force impact onto the first and second part 18, 20 of the cooling element 14, substantially perpendicular to the two side parts 18, 20.

Assembly of a cooling element 14 onto a memory module 10 by means of an assembly device 80 according to embodiments will again be made clear in the following on the basis of FIG. 8.

Figure 8:
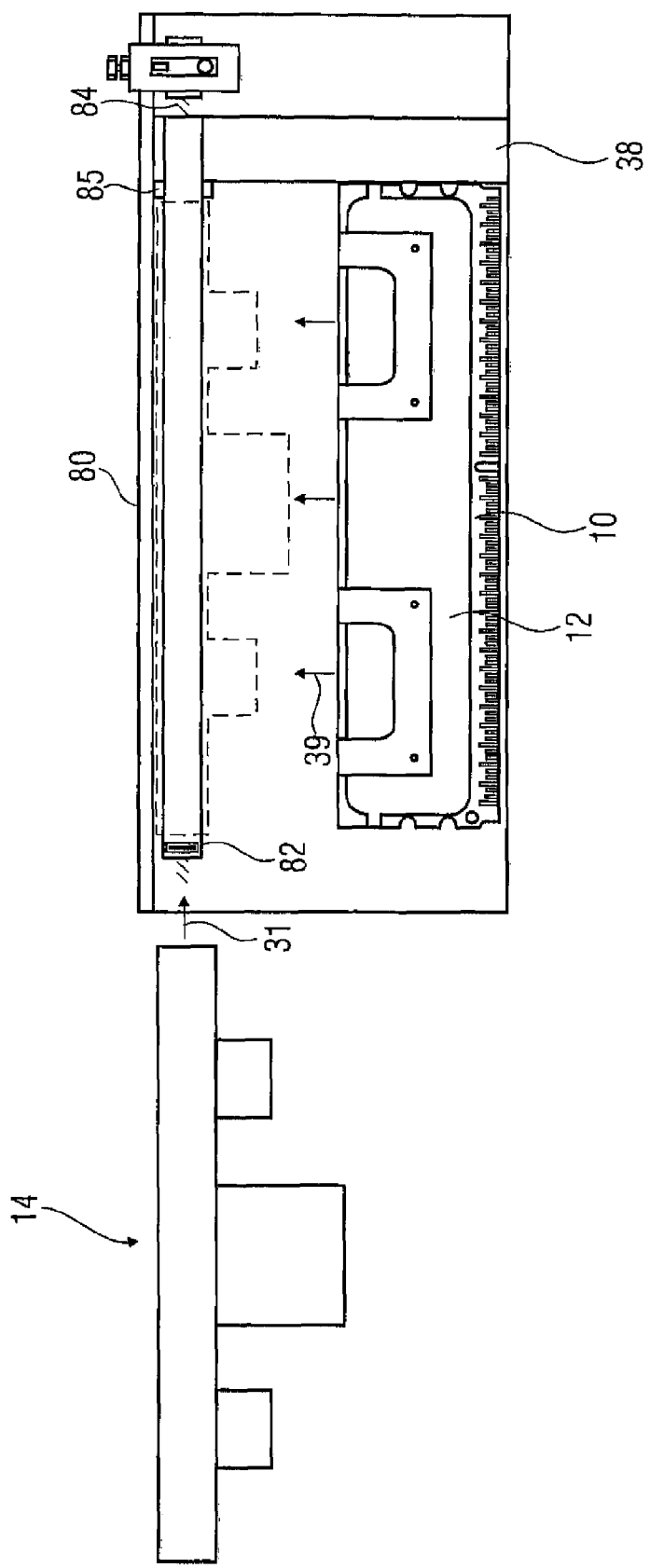
FIG. 8 is a comprehensive illustration for explaining an assembly of a cooling element onto a memory module by means of an assembly device according to an exemplary embodiment.

FIG. 8 shows a cooling element 14, which is slid onto a spreading means 82 of an assembly device 80 in a direction 31. To this end, the spreading means 82 is fixed in the assembly device 80 at a first end, so as to enable sliding the cooling element 14 onto the spreading means 82 from a second end of the spreading means 82. So as to fix the cooling element 14 on the spreading means 82 in a predefined position, the assembly device 80 comprises a spacer 85. The spacer 85 serves to maintain the cooling element on the spreading means 82 in a predefined position with respect to the memory module 10. If the cooling element 14 is in the predefined position default by the spacer 85 after sliding onto the spreading means 82, the first and second side parts 18, 20 of the cooling element 14 can be spread, as described previously. Thereupon, the memory module 10 can be slid between the spread side parts 18, 20 of the cooling element 14 by means of a first guiding region 38 in a direction 39 substantially perpendicular to the direction 31. If the memory module 10 is in the intended position between the spread side parts 18, 20, the spreading is reversed by rotation of the rotation axle 84, so that the memory module is clamped between the first and second side parts 18, 20 of the cooling element 14. Thereupon, the cooling element 14, together with the memory module 10, can be pulled from the spreading means 82 again in a direction opposite to the direction 31.

Figure 9:
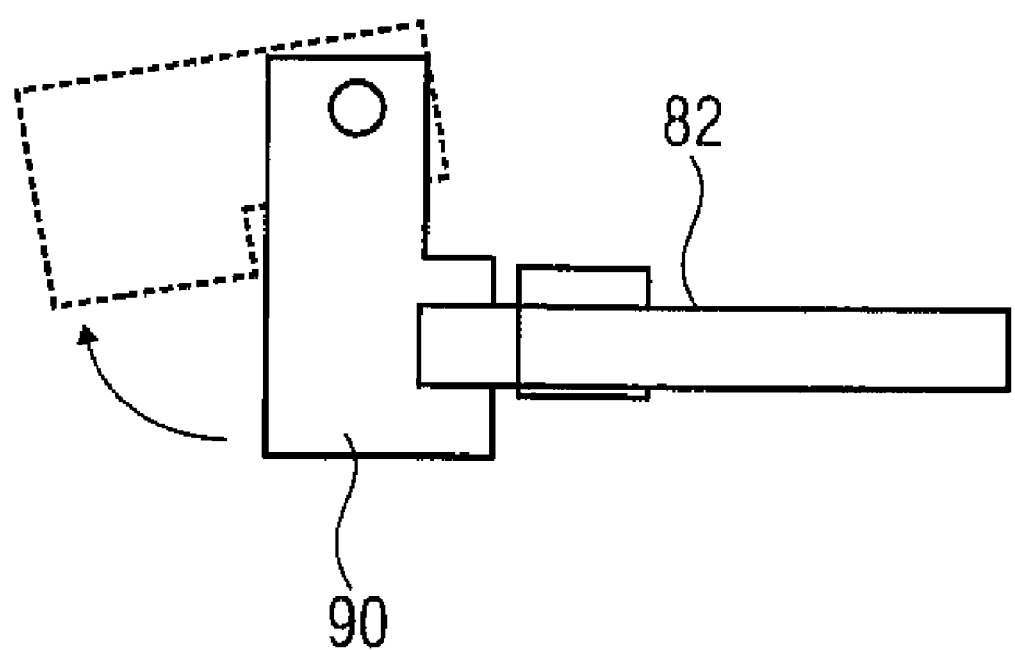
FIG. 9 is a schematic illustration of a fixture for fixing a spreader at one end of the spreader, according to an embodiment.

According to embodiments, the device 80 comprises a fixer for the second end of the spreader or spreading means 82, in order to bring the second end of the spreader 82 from an unfixed state to a fixed state, and vice versa. This may, for example, be necessary when the spreading means 82 lacks stability due to geometrical expansion. A schematic illustration of the fixer is exemplarily shown in FIG. 9.

The fixer 90 for the second end of the spreading means 82 is pivotable from a first position into a second position, according to an embodiment, wherein it supports or fixes the second end of the spreading means 82 in the second position. For sliding the cooling element on and off, the fixer 90 can be pivoted into the second position, in which the spreading means 82 is not supported.

For example, embodiments allow the simple and efficient assembly of an additional cooling element onto a memory module by spreading the first and the second side part of a cooling element apart by converting a rotational movement into a mechanical pressure action on mutually opposite sides of the first and the second side part, so as to be able to guide a predefined region of the memory module between the first and the second side part. The concept presented here is suited for both individual applications and for mass production.

Embodiments of the present invention may include devices and methods adapted for applying cooling elements onto memory modules other than FB-DIMMs or onto other electronic modules. In such embodiments, the cooling element may have a shape different from the described shape, wherein the device for applying the cooling element onto the module may be adapted correspondingly for such cooling elements.

Finally, it is to be pointed to the fact that the present invention is not limited to the respective components of the device or the specific procedure discussed, since these components and methods may vary. The terminology used here only is intended to describe special embodiments and is not used in limiting manner. If the singular or undefined articles are used in the description and in the claims, these also refer to the plurality of these elements, unless uniquely indicated otherwise by the overall context. The same applies in an opposite sense.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. An assembly device for applying a cooling element onto a module, wherein the cooling element comprises a first side part and a second side part opposite the first side part, wherein the first and second side parts are connected by a region, the assembly device comprising:

a spreader, which is adapted to spread apart the first and second side parts by mechanical pressure action, so as to be able to guide a predetermined region of the module between the first and second side parts, wherein the spreader is arranged along a long side of the assembly device at a top of a short side of the assembly device, wherein the spreader comprises two wedges slidable against each other, which are arranged in a first position such that the region of the cooling element can be guided over the two wedges, and which can be brought into a second position by shifting from the first position, so that the wedges in the second position cause a pressure action on the first and second side parts of the cooling element, wherein a first one of the two wedges slidable against each other is fixed by a retaining bolt with respect to the assembly device, and the second wedge is slidable with respect to the first wedge by rotation of a threaded rod in a mating thread arranged on the second wedge;

a first guiding region for the cooling element comprising a first guiding direction, the first guiding region adapted to slide the cooling element onto the spreader; and a second guiding region for the module comprising a second guiding direction, the second guiding direction adapted to move the module along the second direction, wherein the second guiding direction is substantially perpendicular to the first guiding direction.

2. The assembly device according to claim 1, wherein the region, by which the first and second side parts are connected, forms a part of a cooling channel of the cooling element.

3. The assembly device according to claim 2, wherein the spreader comprises a rotatable cam, which can be rotated from a first position into a second position, and wherein the cooling channel of the cooling element can be slid over the rotatable cam in the first position, and wherein the first and second side parts of the cooling element are spread upon rotation of the cam into the second position.

4. The assembly device according to claim 1, wherein the threaded rod is coupled to an actuator, so that the rotation of the threaded rod can be caused by actuation of the actuator.

5. The assembly device according to claim 1, wherein the mating thread arranged on the second wedge is slidably arranged in an axis perpendicular to the threaded rod, so as to be able to balance a movement of the second wedge perpendicular to the threaded rod.

6. The assembly device according to claim 1, wherein the spreader comprises a first end and a second end, and the spreader is fixed at the first end in the assembly device, wherein the second end is adapted so as to enable a slide-on of the cooling element from the second end.

7. The assembly device according to claim 6, wherein the device comprises a fixer for the second end of the spreader, so as to bring the second end of the spreader from an unfixed state into a fixed state, and vice versa.

8. The assembly device according to claim 1, wherein the spreader has a shape that is adapted to the region of the cooling element, so that the region can be slid over the spreader.

9. The assembly device according to claim 1, wherein the device is adapted to apply the cooling element on a memory module.

10. A assembly device for applying a cooling element onto a module, wherein the cooling element comprises a first side part and a second side part opposite to the first side part, wherein the first and second side parts are connected by a region forming a cooling channel of the cooling element, the device assembly comprising:

a spreader with a first end and a second end, which is fixed in the assembly device, wherein the shape of the spreader is adapted to the cooling channel of the cooling element, so that the cooling channel can be slid over the spreader, wherein the spreader is arranged along a long side of the assembly device at a top of a short side of the assembly device, wherein the spreader is adapted to convert a rotational movement into a mechanical pressure force on the first and second side parts, so that the first and second side parts are spread apart by the mechanical pressure force and a predefined region of the module can be guided between the first and second side parts, wherein the spreader comprises two wedges slidable against each other and wherein one of the two wedges is fixed by a retaining bolt with respect to the assembly device.

11. A assembly device for applying a cooling element onto a module, wherein the cooling element comprises a first side part and a second side part opposite the first side part, wherein the first and second side parts are connected by a region, the assembly device comprising:

means for spreading apart the first and second side parts by mechanical pressure action on the first and second side parts, so as to be able to guide a predetermined region of the module between the first and second side parts, wherein the means for spreading apart the first and second side parts are arranged along a long side of the assembly device at a top of a short side of the assembly device, wherein the means for spreading apart the first and second side parts comprise two wedges slidable against each other, which are arranged in a first position such that the region of the cooling element can be guided over the two wedges, and which can be brought into a second position by shifting from the first position, so that the wedges in the second position cause a pressure action on the first and second side parts of the cooling element, wherein a first one of the two wedges slidable against each other is fixed by a retaining bolt with respect to the assembly device, and the second wedge is slidable with respect to the first wedge by rotation of a threaded rod in a mating thread arranged on the second wedge;

first guiding means for guiding the cooling element onto the spreader comprising a first guiding direction; and second guiding means for guiding the module into a predefined position comprising a second guiding direction, wherein the second guiding direction is substantially perpendicular to the first guiding direction.

12. A method for applying a cooling element onto a module, wherein the cooling element comprises a first side part and a second side part opposite to the first side part, wherein the first and second side parts are connected by a region, comprising:

sliding the cooling element onto a spreader of an assembly device so that the first side art is arranged on one side of the spreader and the second side part is arranged on another side of the spreader, the spreader being arranged along a long side of the assembly device at a top of a short side of the assembly device;

spreading apart the first and second side parts by mechanical pressure action on the first and second side parts; and guiding a predetermined region of the module between the first and second side parts; clamping the predetermined region of the module between the first and second side parts of the cooling element; and after clamping the predetermined region of the module between the first and second side parts of the cooling element, removing the cooling element together with the module from the assembly device guiding a predetermined region of the module between the first and second side parts.

13. The method according to claim 12, wherein sliding the cooling element onto the spreader comprises sliding the cooling element along the long side of the assembly device by means of a first guiding region.

14. The method according to claim 13, wherein, after spreading apart, moving the module along the short side into a predetermined position with respect to the spreader by means of a second guiding region.

15. The method according to claim 12, wherein, when spreading apart, converting a rotational movement into a pressure force on mutually opposite sides of the first and second side parts, so that the predetermined region of the module can be guided between the first and second side parts.

16. The method according to claim 12, wherein the module is a memory module.

* * * * *